(12) United States Patent
Qiu et al.

(10) Patent No.: US 8,044,303 B2
(45) Date of Patent: Oct. 25, 2011

(54) TRACE CARRIER

(75) Inventors: Yu-Huan Qiu, Shanghai (CN);
Wen-Kang Fan, Taipei (TW)

(73) Assignee: Inventec Corporation, Taipei (TW)

( * ) Notice: Subject to any disclaimer, the term of this patent is extended or adjusted under 35 U.S.C. 154(b) by 870 days.

(21) Appl. No.: 12/098,661

(22) Filed: Apr. 7, 2008

(65) Prior Publication Data

US 2009/0223702 A1 Sep. 10, 2009

(30) Foreign Application Priority Data

Mar. 4, 2008 (TW) ................. 97107489 A

(51) Int. Cl.
*H05K 1/03* (2006.01)

(52) U.S. Cl. ............ 174/255; 174/15.1; 174/17 R; 174/34; 174/36; 174/113 R; 174/128.1; 361/600; 361/679

(58) Field of Classification Search .......... 174/255, 174/15.5, 17 R, 34, 63, 113 R, 128.1, 36; 361/600, 679; 439/483
See application file for complete search history.

(56) References Cited

U.S. PATENT DOCUMENTS

| | | | | |
|---|---|---|---|---|
| 3,654,543 A * | 4/1972 | Isogai et al. | | 363/68 |
| 3,678,177 A * | 7/1972 | Lawrenson | | 174/113 C |
| 3,749,811 A * | 7/1973 | Bogner et al. | | 174/15.5 |
| 3,852,181 A * | 12/1974 | Cirkler et al. | | 204/298.25 |
| 4,313,491 A * | 2/1982 | Molitor | | 165/83 |
| 4,697,051 A * | 9/1987 | Beggs et al. | | 178/63 D |
| 4,741,708 A * | 5/1988 | Yoshida | | 439/483 |
| 4,873,393 A * | 10/1989 | Friesen et al. | | 174/34 |
| 5,039,964 A * | 8/1991 | Ikeda | | 333/181 |
| 5,411,024 A * | 5/1995 | Thomas et al. | | 600/325 |
| 6,344,701 B1 * | 2/2002 | Kawamura et al. | | 307/105 |
| 6,378,283 B1 * | 4/2002 | Barton | | 57/58.52 |
| 6,396,033 B1 * | 5/2002 | Renwick et al. | | 219/538 |
| 6,501,991 B1 * | 12/2002 | Honeck et al. | | 607/122 |
| 2002/0050394 A1 * | 5/2002 | Clark et al. | | 174/128.1 |
| 2005/0136604 A1 * | 6/2005 | Al-Bayati et al. | | 438/301 |

* cited by examiner

*Primary Examiner* — Xiaoliang Chen
(74) *Attorney, Agent, or Firm* — J.C. Patents

(57) ABSTRACT

A trace carrier is provided. The trace carrier includes a first insulating tube, a second insulating tube, a trace pair, and a sealed hollow insulating cylinder. The trace pair is passing through the first insulating tube and the second insulating tube, and is coiled up in an inner space of the first insulating tube and the second insulating tube. The sealed hollow insulating cylinder encapsulates the first insulating tube, the second insulating tube, and the trace pair, but the four terminals of the trace pair are exposed to the outside of the sealed hollow insulating cylinder.

8 Claims, 2 Drawing Sheets

TRACE CARRIER

CROSS-REFERENCE TO RELATED APPLICATION

This application claims the priority benefit of Taiwan application serial no. 97107489, filed on Mar. 4, 2008. The entirety the above-mentioned patent application is hereby incorporated by reference herein and made a part of specification.

BACKGROUND OF THE INVENTION

1. Field of the Invention

The present invention generally relates to a trace carrier, in particular, to a trace carrier capable of saving a plane area for trace routing of a layout design.

2. Description of Related Art

In design of a printed circuit board (PCB) layout, designers often encounter with the problem of insufficient trace area. Therefore, they always try hard to squeeze some extra space from the original layout design and sometimes even have to make a big fuss over the variation of the layout design to solve the above problem.

However, the high-speed signal trace for transmitting, for example, the data strobe signal (a kind of differential signal, also called DQS signal) used by the double data rate 2 (DDR2) memory and the double data rate 3 (DDR3) memory has more stringent requirements for the trace length and the trace area. However, the trace area for such high-speed signal trace is hard to handle. Therefore, no good and effective solutions have been set forth to solve the problem of insufficient trace area and the signal transmission quality of the high-speed signal trace will also be influenced by the above problem to a certain extent.

SUMMARY OF THE INVENTION

Accordingly, the present invention is directed to a trace carrier capable of saving a plane area for trace routing of a layout design.

The present invention provides a trace carrier, which includes a first insulating tube, a second insulating tube, a trace pair, and a sealed hollow insulating cylinder. The trace pair is passing through the first insulating tube and the second insulating tube, and is coiled up in an inner space of the first insulating tube and the second insulating tube. The sealed hollow insulating cylinder is used for encapsulating the first insulating tube, the second insulating tube, and the trace pair, but four terminals of the trace pair are exposed to the outside of the sealed hollow insulating cylinder.

In an embodiment of the present invention, major axes of the first insulating tube, the second insulating tube, and the sealed hollow insulating cylinder extend in a same direction. The first insulating tube and the second insulating tube have a same size. The sealed hollow insulating cylinder has a radius twice that of the first insulating tube. The trace pair is coiled up against inner walls of the first insulating tube and the second insulating tube.

In an embodiment of the present invention, an outer surface of the sealed hollow insulating cylinder is further provided with four bonding pads, and each terminal of the trace pair is further exposed to the outside of the sealed hollow insulating cylinder via one of the four bonding pads.

In an embodiment of the present invention, the first insulating tube and the second insulating tube are both designed in a manner expressed by an equation of $A=B+C+(\tfrac{1}{2})S$. In the equation, A denotes the radius of the first insulating tube, B denotes a thickness of the bonding pads, C denotes a thickness of a tube wall of the first insulating tube, and S denotes a required smallest spacing between the trace pair and other traces.

In an embodiment of the present invention, a pitch of coils formed by the trace pair is also S.

The present invention provides a design of a trace carrier comprised of two insulating tubes, a trace pair, and a sealed hollow insulating cylinder. The trace pair is coiled up in an inner space of the two insulating tubes. Thus, the users may use the trace pair in the trace carrier to replace traces originally needed to be routed on a PCB. In this way, a three-dimensional trace is achieved, thus saving the plane area for trace routing of the layout design and meanwhile solving the problem of insufficient trace area. In addition, if the trace pair in the trace carrier is used to replace a high-speed signal trace pair in the original layout design, the radii of the two insulating tubes may be calculated based on a specific equation and the trace pair is coiled up according to a predetermined coil pitch, so as to avoid the signal interference.

In order to the make aforementioned and other objects, features and advantages of the present invention comprehensible, preferred embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
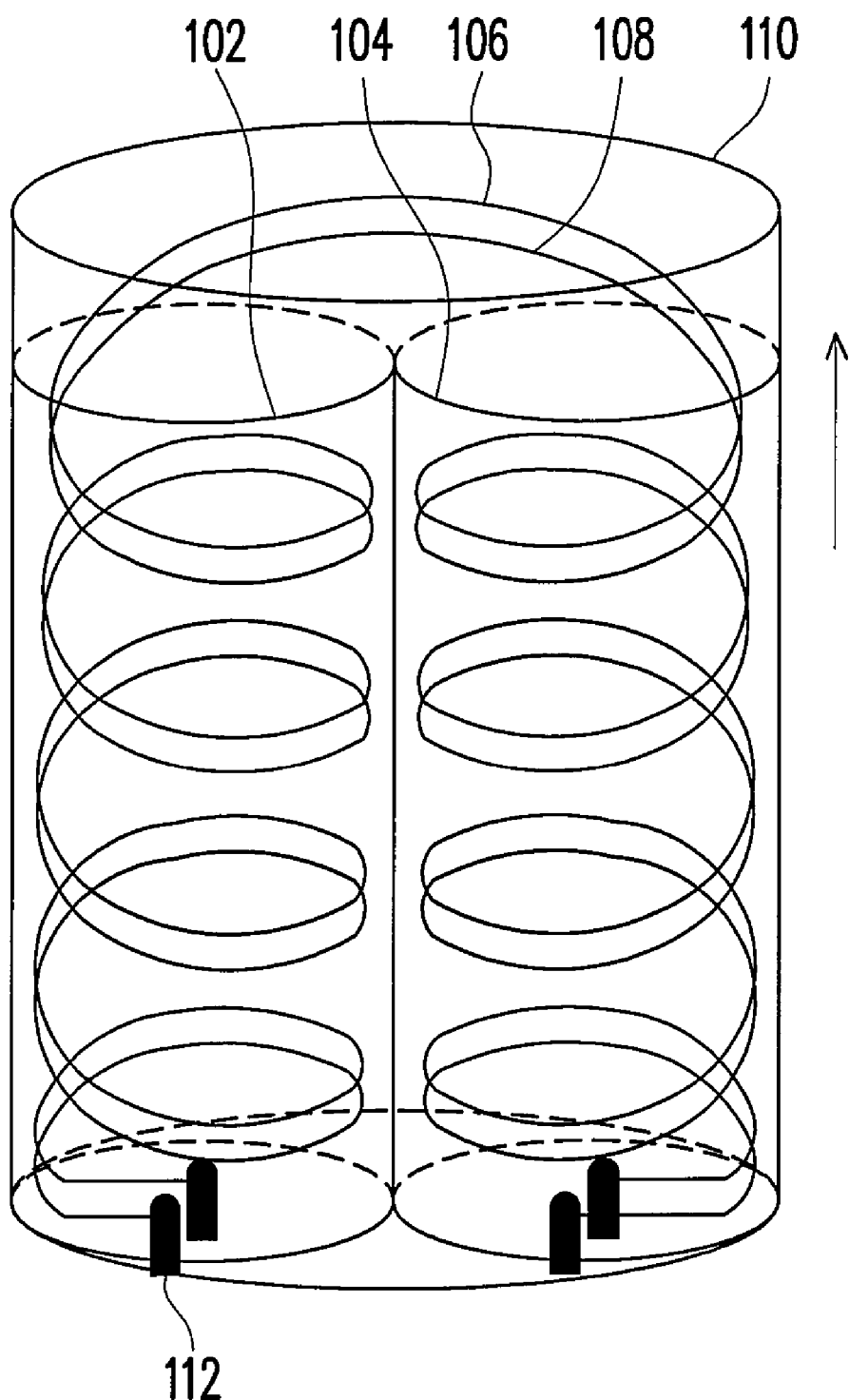
FIG. 1 is a perspective view illustrating a structure of a trace carrier according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

In order to make the content of the present invention more apparent, for example, the trace pair in the trace carrier is used to replace the high-speed signal trace pair for transmitting the data strobe signal used by the DDR2 memory or the DDR3 memory in the following embodiments.

FIG. 1 is a perspective view illustrating a structure of a trace carrier according to an embodiment of the present invention. The trace carrier includes insulating tubes 102, 104, a trace pair comprised of traces 106, 108, and a sealed hollow insulating cylinder 110. The trace pair is passing through the insulating tubes 102, 104, and is coiled up in an inner space of the two insulating tubes. The sealed hollow insulating cylinder 110 is used for encapsulating the insulating tubes 102, 104 and the trace pair. An outer surface of this sealed hollow insulating cylinder 110 is provided with four bonding pads (denoted by the mark 112), and each terminal of the trace pair is further exposed to the outside of the sealed hollow insulating cylinder 110 via one of the four bonding pads. It should be noted that since the traces 106, 108 compose the trace pair, the two traces are parallel to each other.

In this example, major axes of the insulating tubes 102, 104 and the sealed hollow insulating cylinder 110 are designed to extend in the same direction, i.e. in the direction pointed by arrow. The insulating tubes 102, 104 have the same size. The sealed hollow insulating cylinder 110 has a radius twice that of the insulating tube 102. The trace pair is coiled up against inner walls of the insulating tubes 102, 104. In addition, the insulating tubes 102, 104 are both designed in a manner expressed by the following equation (1):

$$A = B + C + (\tfrac{1}{2})S \qquad \text{equation (1)},$$

where A denotes the radius of the insulating tube 102, B denotes a thickness of the bonding pads, C denotes a thickness of a tube wall of the insulating tube 102, and S denotes a required smallest spacing between the trace pair and other traces. In order to avoid the signal interference between the trace pair, a pitch of coils formed by the trace pair is preferably S.

Figure 2:
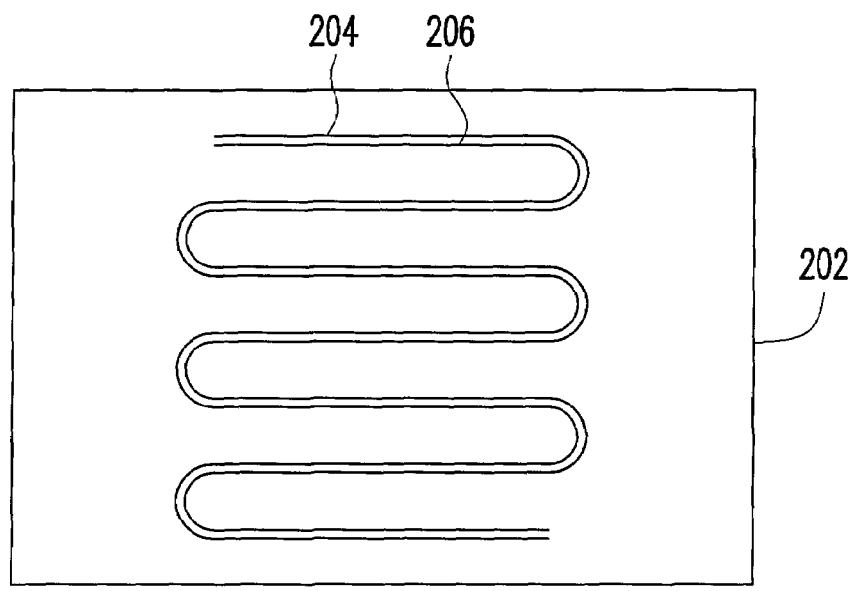
FIG. 2 is a schematic view illustrating a high-speed signal trace pair for transmitting a data strobe signal originally needed to be routed on a top layer of a PCB.
Figure 3:
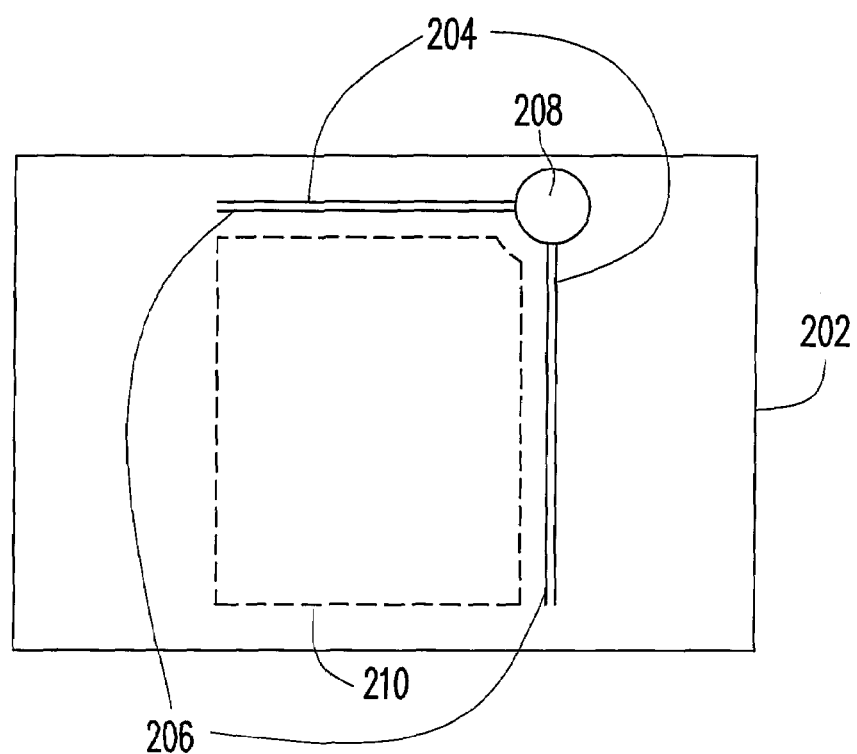
FIG. 3 is a schematic view illustrating the use of a trace carrier to replace the high-speed signal trace pair of FIG. 2.

FIG. 2 is a schematic view illustrating a high-speed signal trace pair for transmitting a data strobe signal originally needed to be routed on a top layer of a PCB. In FIG. 2, the mark 202 denotes the PCB, and two parallel traces denoted by the marks 204 and 206 are the high-speed signal trace pair for transmitting the data strobe signal. As shown in FIG. 2, this high-speed signal trace pair occupies larger plane area for trace routing. Therefore, the users may use the trace carrier shown in FIG. 1 to replace most segments of the high-speed signal trace pair, as shown in FIG. 3. FIG. 3 is a schematic view illustrating the use of a trace carrier to replace the high-speed signal trace pair of FIG. 2. In FIG. 3, the mark 202 also denotes the PCB, and the two parallel traces denoted by the marks 204 and 206 are also the high-speed signal trace pair for transmitting the data strobe signal. The mark 208 denotes the trace carrier of FIG. 1. Since signals transmitted by the high-speed signal trace pair may propagate through the trace pair in the trace carrier 208, the plane area (denoted by the mark 210) for trace routing originally needed to be occupied by the high-speed signal trace pair is saved. Therefore, the problem of insufficient plane area for trace routing of the PCB is effectively solved.

It is understood that if the trace pair in the trace carrier is not used to replace the high-speed signal trace pair (for example, the high-speed signal trace pair for transmitting the data strobe signal) with higher requirements, the insulating tubes, the coiling up manner of the trace pair, and the sealed hollow insulating cylinder in the trace carrier are not required to be designed strictly following the above descriptions. If the trace pair in the trace carrier is used to replace an ordinary non-high-speed signal trace pair, the requirements for the design of the trace carrier may be less stringent. In applications of other forms, the major axes of the two insulating tubes and the sealed hollow insulating cylinder of the trace carrier may be designed to extend in different directions, and the sizes of the two insulating tubes may be different. In addition, the radius of the sealed hollow insulating cylinder may not be twice that of the insulating tube, and the trace pair inside the trace carrier may not be coiled up against the inner walls of the two insulating tubes. Similarly, the two insulating tubes inside the trace carrier may be designed in other manners different from the manner expressed by the equation (1).

In addition, those of ordinary skill in the art should know that even if the sealed hollow insulating cylinder of the trace carrier have no bonding pads, it is implementable as long as the sealed hollow insulating cylinder still encapsulates the two insulating tubes and the trace pair, and the four terminals of the trace pair are exposed to the outside of the sealed hollow insulating cylinder.

In the present invention, the insulating material of the two insulating tubes and the sealed hollow insulating cylinder of the trace carrier may be a resin (pre-preg), and the four bonding pads on the outer surface of the sealed hollow insulating cylinder may be realized by a copper foil. In addition, in order to ensure the integrity of the signals transmitted by the trace carrier, the users may also encapsulate the outer surface of the sealed hollow insulating cylinder with a metal reference layer, for further isolating the external interference. However, the metal reference layer is not required to be electrically connected to the four terminals of the trace pair exposed to the outside of the sealed hollow insulating cylinder nor the four bonding pads on outer surface of the sealed hollow insulating cylinder. Among the materials used as the metal reference layer, an aluminum alloy is a better choice.

Although in the above-mentioned description of the embodiments, the trace pair in the trace carrier in used to replace the trace pair originally needed to be routed on the PCB, the present design may be further used to replace other traces besides the trace pair. In addition, although in the above-mentioned description of the embodiments, the trace pair in the trace carrier in used to replace the traces originally needed to be routed on the top layer of the PCB, the design of the present invention may also be used to replace the traces on a bottom layer of the PCB as well as the traces on an intermediate layer between the top layer and the bottom layer.

In view of the above, the present invention provides a design of a trace carrier comprised of two insulating tubes, a trace pair, and a sealed hollow insulating cylinder, and the trace pair is coiled up in an inner space of the two insulating tubes, and thus users may use the trace pair in the trace carrier to replace traces originally needed to be routed on a PCB. In this way, a three-dimensional trace is achieved, thus saving the plane area for trace routing of the layout design and meanwhile solving the problem of insufficient trace area. In addition, if the trace pair in the trace carrier is used to replace a high-speed signal trace pair in the original layout design, the radii of the two insulating tubes may be calculated based on a specific equation and the trace pair may be coiled up according to a predetermined coil pitch to avoid the signal interference. In order to ensure the integrity of the signals transmitted by the trace carrier, the users may also encapsulate an outer surface of the sealed hollow insulating cylinder with a metal reference layer, for further isolating the external interference.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A trace carrier, comprising:
   a first insulating tube;
   a second insulating tube;
   a trace pair, passing through the first insulating tube and the second insulating tube, and being coiled up in an inner space of the first insulating tube and the second insulating tube; and
   a sealed hollow insulating cylinder, encapsulating the first insulating tube, the second insulating tube, and the trace pair, but exposing four terminals of the trace pair to the outside of the sealed hollow insulating cylinder, wherein the outer surface of the sealed hollow insulating cylinder is further encapsulated with a metal reference layer, and the metal reference layer is not electrically connected to the four terminals of the trace pair exposed to the outside of the sealed hollow insulating cylinder.

2. The trace carrier according to claim 1, wherein major axes of the first insulating tube, the second insulating tube, and the sealed hollow insulating cylinder extend in a same direction, the first insulating tube and the second insulating tube are of a same size, a radius of the sealed hollow insulating cylinder is twice that of the first insulating tube, and the trace pair is coiled up against inner walls of the first insulating tube and the second insulating tube.

3. The trace carrier according to claim 2, wherein an outer surface of the sealed hollow insulating cylinder is further provided with four bonding pads, and each terminal of the trace pair is further exposed to the outside of the sealed hollow insulating cylinder via one of the four bonding pads.

4. The trace carrier according to claim 3, wherein the four bonding pads are all copper foils.

5. The trace carrier according to claim 3, wherein the first insulating tube is designed in a manner expressed by the following equation:

$$A = B + C + (½)S,$$

where A denotes the radius of the first insulating tube, B denotes a thickness of the bonding pads, C denotes a wall thickness of the first insulating tube, and S denotes a required smallest spacing between the trace pair and other traces.

6. The trace carrier according to claim 5, wherein a pitch of coils formed by the trace pair is S.

7. The trace carrier according to claim 1, wherein insulating materials of the first insulating tube, the second insulating tube, and the sealed hollow insulating cylinder are all resins.

8. The trace carrier according to claim 1, wherein a material of the metal reference layer is an aluminum alloy.

* * * * *